United States Patent [19]
Thrower et al.

[11] Patent Number: 5,635,873
[45] Date of Patent: Jun. 3, 1997

[54] OPERATIONAL AMPLIFIER HAVING DUMMY ISOLATION STAGE

[75] Inventors: Mark L. Thrower, Dallas; Michael D. Smith, Lewisville, both of Tex.

[73] Assignee: Dallas Semiconductor Corp., Dallas, Tex.

[21] Appl. No.: 608,209

[22] Filed: Feb. 28, 1996

Related U.S. Application Data

[60] Continuation of Ser. No. 280,097, Jul. 25, 1994, abandoned, which is a division of Ser. No. 874,670, Apr. 27, 1992, Pat. No. 5,381,034.

[51] Int. Cl.$^6$ .................................................. H03F 3/45
[52] U.S. Cl. .................................... 330/253; 330/261
[58] Field of Search ................................ 330/253, 261, 330/300

[56] References Cited

U.S. PATENT DOCUMENTS

| | | | |
|---|---|---|---|
| 3,546,481 | 12/1970 | Talley | 330/261 X |
| 4,225,878 | 9/1980 | Dobkin | 217/530 |
| 4,379,267 | 4/1983 | Young | 330/253 |
| 4,484,148 | 11/1984 | Wieser et al. | 330/253 |
| 4,661,779 | 4/1987 | Okamoto | 330/253 |
| 4,667,164 | 5/1987 | Doluca | 330/300 X |
| 5,029,284 | 7/1991 | Feldbaumer et al. | 307/443 |
| 5,099,148 | 3/1992 | McClure et al. | 307/443 |

*Primary Examiner*—James B. Mullins
*Attorney, Agent, or Firm*—Jenkens & Gilchrist, P.C.

[57] ABSTRACT

An integrated circuit terminator for a SCSI bus with resistors made of laser-blowable fuses in an array and a reference voltage source made with a bandgap generator and a two stage amplifier including a dummy isolation stage for providing symmetrical mismatch currents.

5 Claims, 8 Drawing Sheets

OPERATIONAL AMPLIFIER HAVING DUMMY ISOLATION STAGE

This application is a continuation of application Ser. No. 08/280,097, filed on Jul. 25, 1994, now abandoned, which is a division of application Ser. No. 07/874,670, filed on Apr. 27, 1992, now U.S. Pat. No. 5,381,034.

PARTIAL WAIVER OF COPYRIGHT PURSUANT TO 1077 O.G. 22

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present invention relates to electronic devices, and, more particularly, semiconductor devices useful in electronic communications on small computer system interface busses.

SCSI Bus

Communications between a computer system's central processor and peripheral devices typically occur over a parallel I/O bus. Tile Small Computer System Interface ("SCSI") bus is a parallel, multimaster I/O bus which has become a standard for processor communications with disk drives (both floppy and hard), tape drives, CD-ROMs, WORM drives, communications devices, and even bar code readers. The SCSI standard appears as ANSI X3.131-1986 and provides for 8-bit parallel data transfer with SCSI-2 proposing 16-bit and 32-bit capabilities at frequencies up to 10 MHz.

FIG. 1a schematically illustrates host computer 102 connected to peripherals 104 and 106 by the SCSI bus made of 50-conductor cables 114 and 116; cables 114 and 116 connect together inside of peripheral 104. The lines of a SCSI bus must be terminated, and cable 118 (which connects to cable 116 inside peripheral 106) leads to terminator 108. Host 102 may have an internal SCSI bus terminator for the other end of the bus. SCSI busses may be single-ended or differential; the signals on single-ended SCSI lines use a low close to ground and a high of about 3 volts, whereas the signals on differential SCSI lines use the polarity of the voltage difference between two lines with a difference magnitude minimum of 1 volt. A single-ended SCSI bus has 26 of the 50 lines of the 50-conductor cable tied to ground, whereas the differential SCSI bus grounds only 7 lines and has twice as many active lines as a single-ended SCSI bus due to its differential signal format. SCSI-2 proposes a 68-conductor cable to provide the extra data lines for 16-bit parallel data transfers.

In addition to the parallel data lines, a SCSI bus has lines for ground (GROUND), terminator power (TERMPWR), attention (ATN), busy (BSY), acknowledge (ACK), reset (RST), message (MSG), select (SEL), control/data (C/D), request (REQ) and input/output (I/O).

A SCSI bus includes a line in the 50-conductor cable to provide power (at about +5 volts) to the bus terminators; host 102 typically will power this line. FIG. 1b shows the single-ended passive terminator as consisting of a 220 ohm resistor in series with a 330 ohm resistor, so the lines will be biased to about +3 volts for a +5 volt terminator power (TERMPWR). The passive terminator for a differential SCSI has for each pair of lines a simple resistor string, as shown in FIG. 1c, connecting terminator power (TERMPWR) to ground with taps for the pair of lines (the RESERVED, GROUND, and TERMPWR lines are not terminated). Thus a +5 volt terminator power will bias the lines to about +2 and +3 volts for the − and + lines, respectively. Note that SCSI drivers are typically open collector, as indicated by FIG. 3. Thus drivers pull the lines low and released lines are pulled high by the terminator.

In contrast, the active terminator for single-ended SCSI-2 (also known as Alternative-2, Alt-2, or Boulay terminator) preferably supplies a 2.85 volts source in series with a 110 ohm resistor to each signal line (again, except for RESERVED, GROUND, and TERMPWR lines). Such a single-ended SCSI-2 active bus terminator will pull up the signal lines to 2.85 volts when the bus drivers of host 102 and peripherals 104 and 106 are off (in a high impedance state) and will supply current (about 22 mA) to cause a voltage drop of roughly 2.5 volts in the 110 ohm resistors when a bus driver on the line pulls it active low to about 0.5 volt. FIG. 2 shows a block diagram of the preferred single-ended SCSI terminator of ANSI X3. 131-1986.

The single-ended SCSI passive terminator has the problem of fluctuations of the voltage level in the power supply on line TERMPWR, injecting noise through the voltage reference and onto the signal lines; in addition, the Thevenin equivalent resistance 132 ohms does not match the cable characteristic impedance (90 to 140 ohms), thus causing signal reflections at higher frequencies and longer bus distances. And longer cable lengths will have greater transmission line effects, greater terminator power (TERMPWR) voltage drop giving lower pullup voltages in the passive terminator. And higher frequencies implies greater reflections from impedance mismatches, more noise injection, an so forth. However, active terminators can mitigate such problems at the cost of increased complexity. Consequently, there is a need for simple active terminators.

BRIEF DESCRIPTION OF THE DRAWINGS

The present invention will be described with reference to the accompanying drawings, which are schematic for clarity.

DESCRIPTION OF THE PREFERRED EMBODIMENTS

SCSI Bus Configuration

Figure 1A:
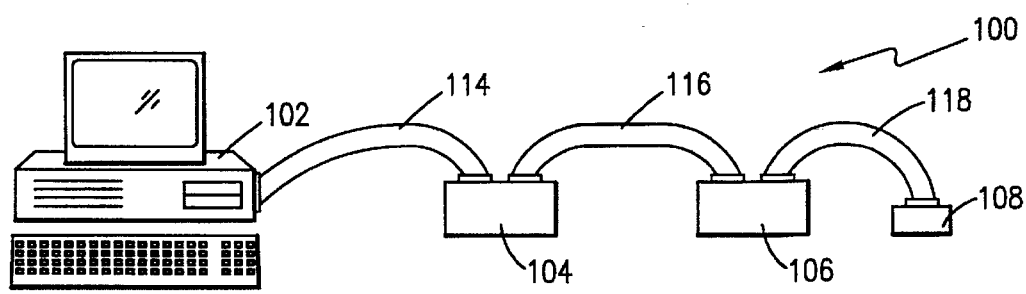
FIG. 1a illustrates a SCSI bus application.
Figure 1B:
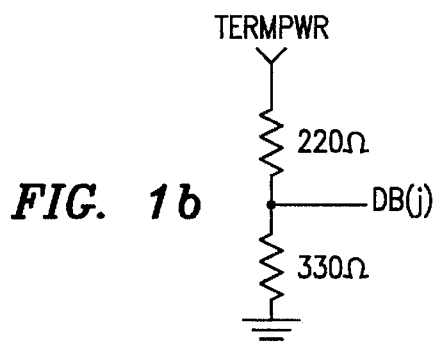
FIGS. 1b–1c show SCSI bus passive terminators.
Figure 1C:
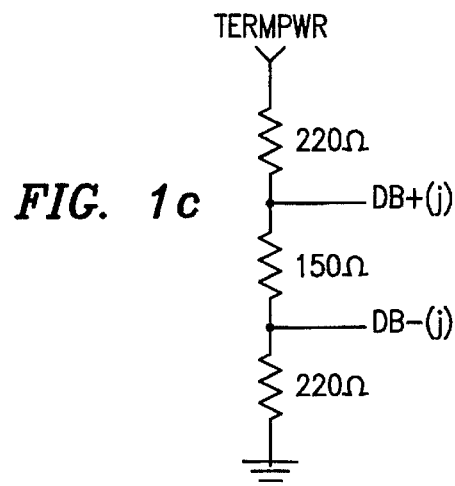
Figure 3:
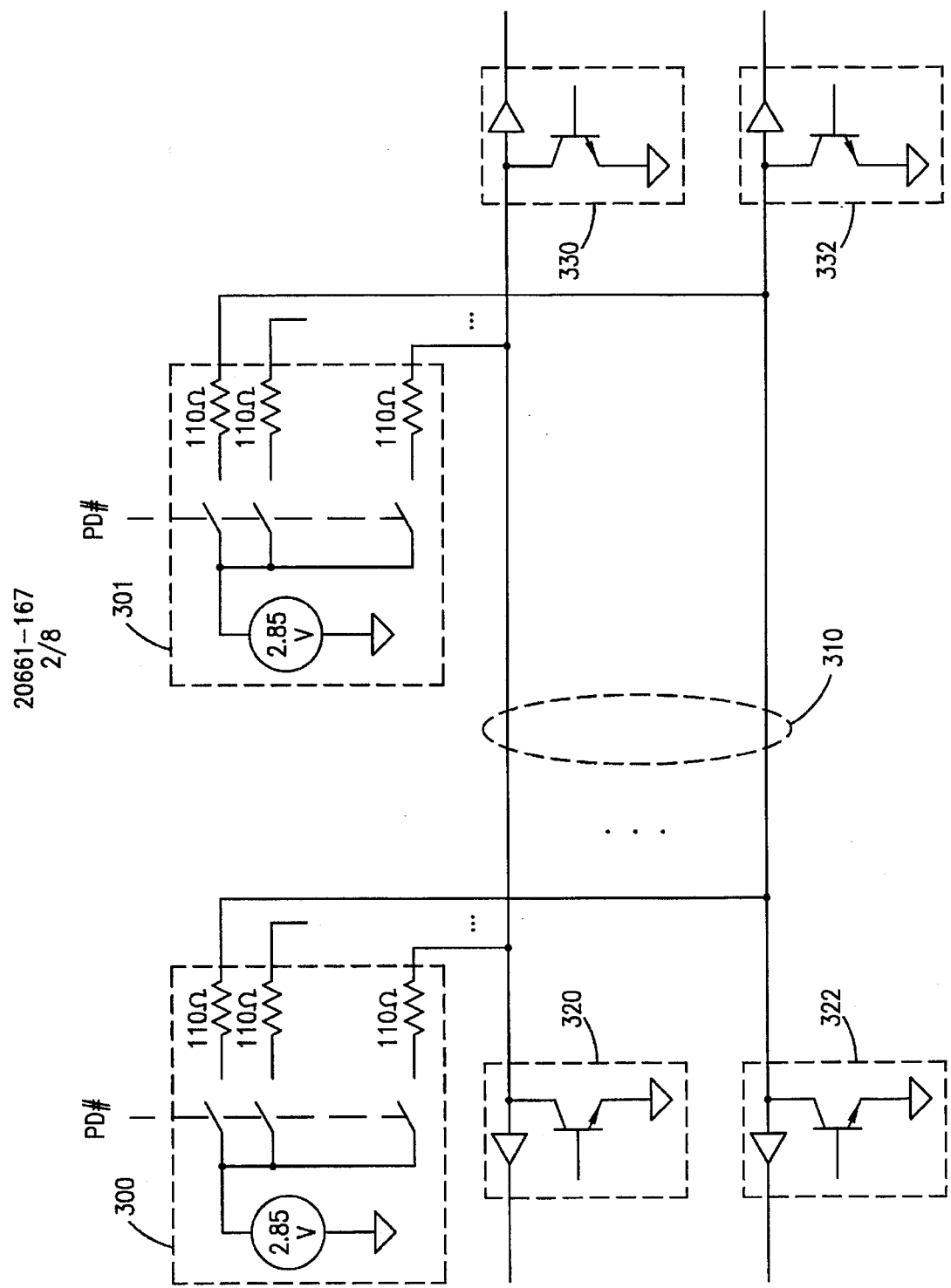
FIG. 3 (bows first preferred embodiment active terminators 108 at the ends of a SCSI bus 118.

FIG. 3 schematically shows first preferred embodiment single-ended SCSI bus active terminators 300 and 301 at the ends of SCSI bus 310. Bus 310 typically takes the form of a series of daisy-chained cables with SCSI devices at stubs along the bus; this is the situation of FIG. 1 with cables 114, 116, and 118 together with the connections inside of the devices forming the bus. FIG. 3 also schematically illustrates bus drivers 320 and 322 which belong to a SCSI device on bus 310, and drivers 330 and 332 which belong to a second SCSI device on bus 310. Terminators 300 and 310 are in the form of integrated circuits which can be held in 16-pin SOIC (300 mil) packages. As discussed in the following, terminators 300 and 301 can be inactivated by application of a power down signal: this can be used to decouple terminators 300 or 301 from bus 310 to accommodate extending bus 3 10 by the addition of further SCSI devices to the bus. In contrast, a discrete resistor array soldered on a printed circuit board would be difficult to remove or inactivate.

SCSI Terminator

Figure 2:
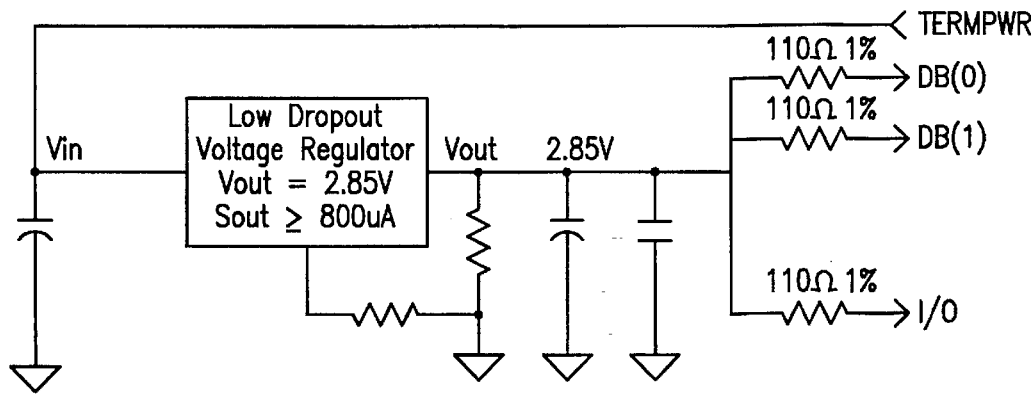
FIG. 2 is a functional/structural block circuit diagram of a single-ended SCSI bus active terminator.
Figure 4:
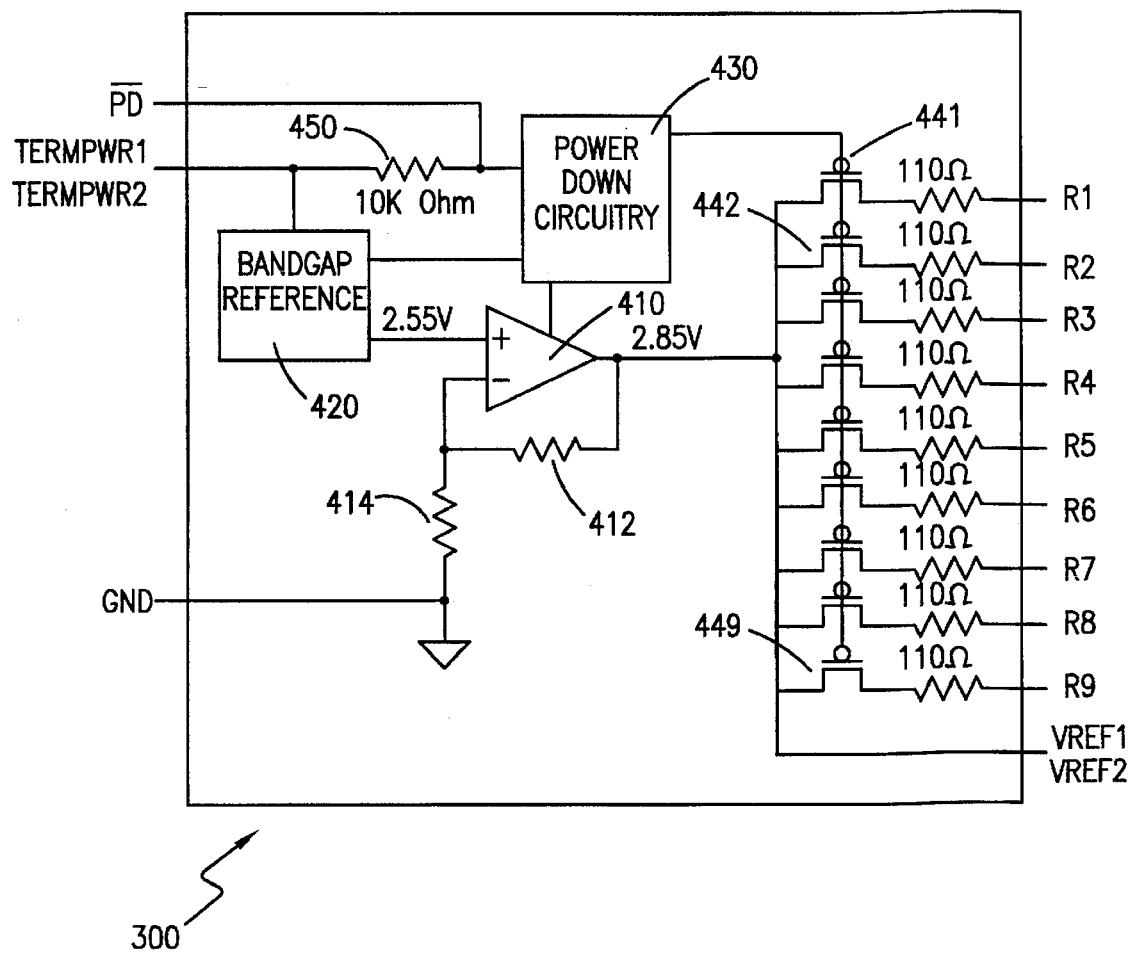
FIG. 4 is a functional/structural block circuit diagram of a first preferred embodiment single-ended SCSI active terminator 108 that has an array of resistors, each of which has a resistance equal to about 1.10 ohms, integrated into the overall functional/block circuit.

FIG. 4 shows the functional blocks of terminator 300 which include nine 110 ohm resistors plus terminals R1, R2, ... R9, buffer operational amplifier 410, resistors 412 and 414 which set the output of amplifier 410 in terms of its noninverting input, bandgap voltage reference generator 420 feeding the noninverting input of amplifier 410, power down circuitry 430, terminator input power terminals TERMPWR1 and TERMPWR2, ground terminal GND, power down input terminal PD#, and reference voltage output terminals VREF1 and VREF2. Bandgap reference voltage generator 420 outputs a temperature-independent 2.55 volts which amplifier 410 multiplies up to 2.85 volts as required by the ANSI standard of FIG. 2. Thus the ratio of the resistance of resistor 412 to that of resistor 414 is 651. Amplifier 410 can provide 24 mA to each of the 110 ohm resistors and terminal R1, R2, ... R9 when the corresponding line is pulled to ground by one of the drivers such as 320, 322, 330, or 332.

Figure 5:
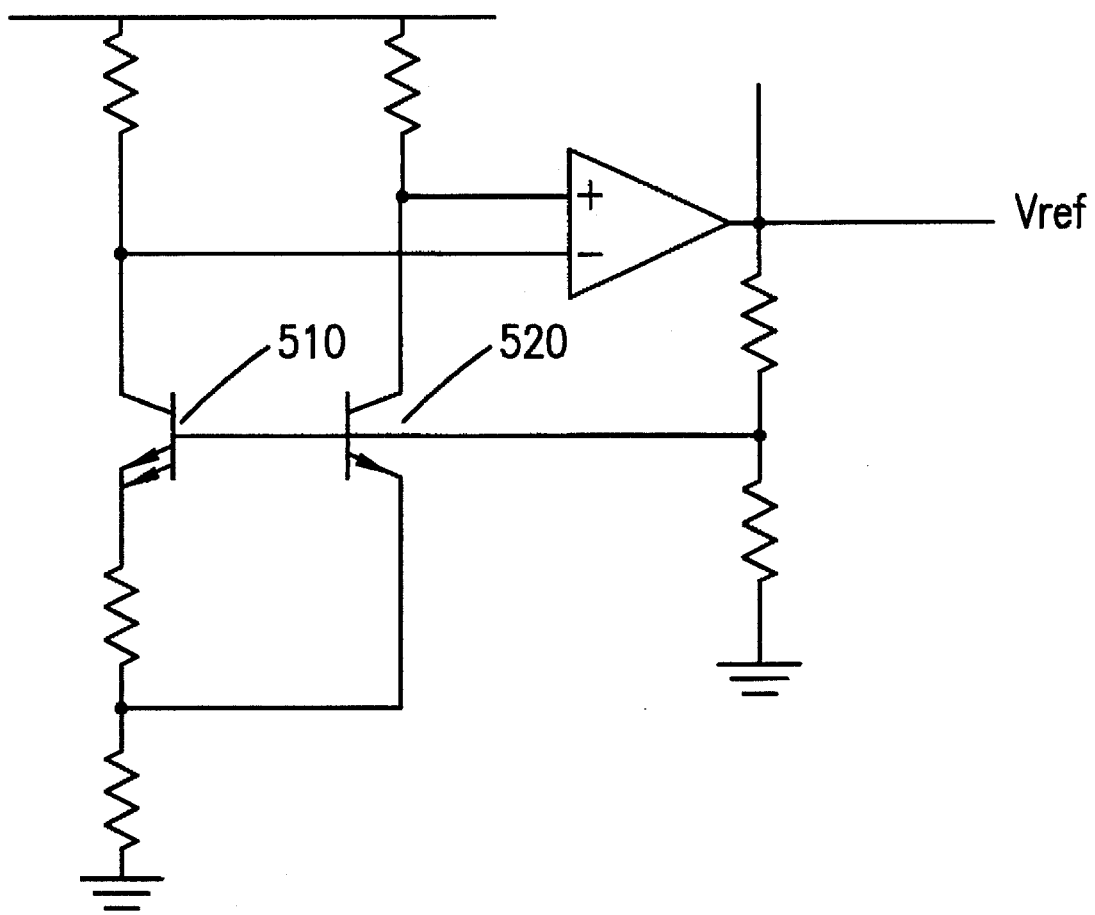
FIG. 5 schematically shows a prior art bandgap generator.

Bandgap reference voltage generator 420 may be of standard design such illustrated in FIG. 5 and which uses equal currents through different sized bipolar transistors 5 10 and 520.

Power down circuitry 430 includes a standard TTL level input buffer and pull up resistor 450 which ties PD# to TERMPWR. The output drives the resistor isolation switches 442 and places bandgap reference 420 and buffer amplifier 410 in a low power state when PD# is driven low.

Amplifier

Amplifier 410 has increased power supply noise rejection and increased output drive to provide the high current required to drive the bus through resistors R1, R2. R9. FIG. 7 is a schematic circuit diagram of amplifier 700 which is used for amplifier 410. To understand the operation of amplifier 700, first consider operation of a known amplifier as shown in FIG. 6.

Figure 6:
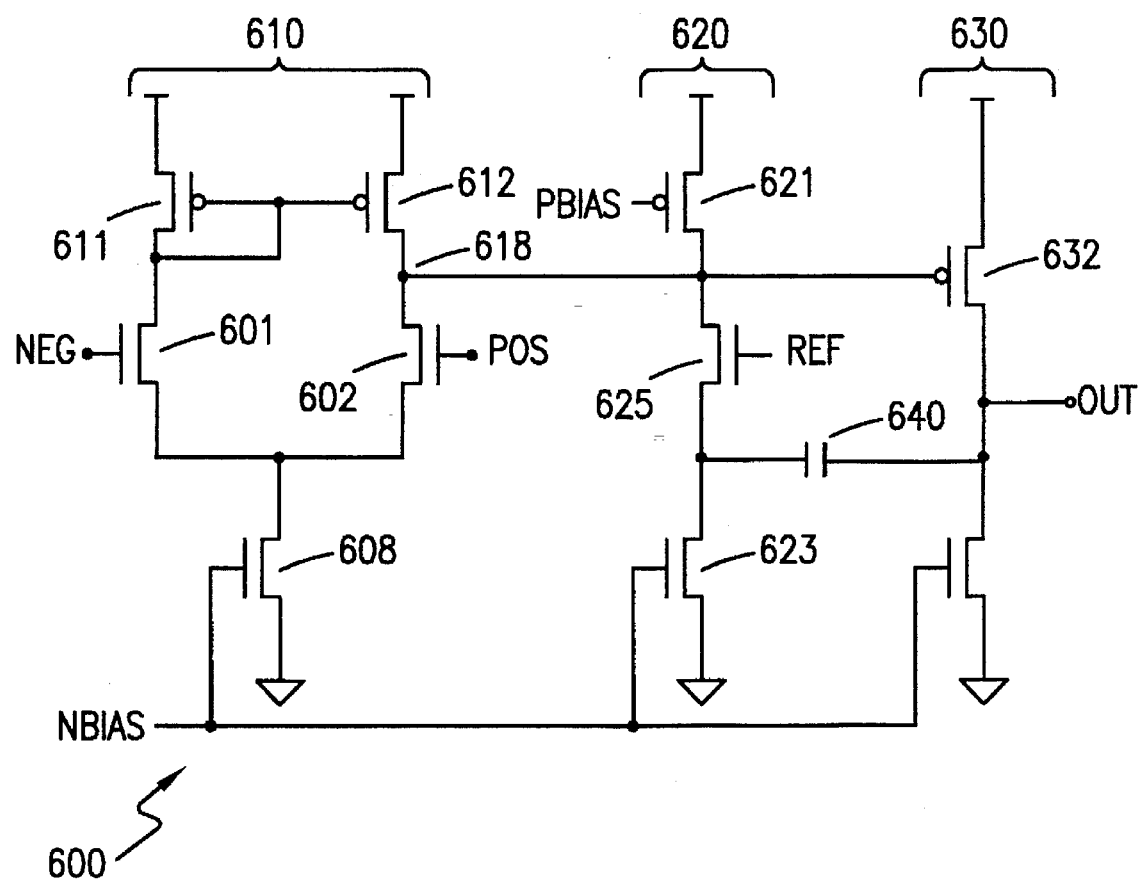
FIG. 6 schematically shows a prior art amplifier.
Figure 7:
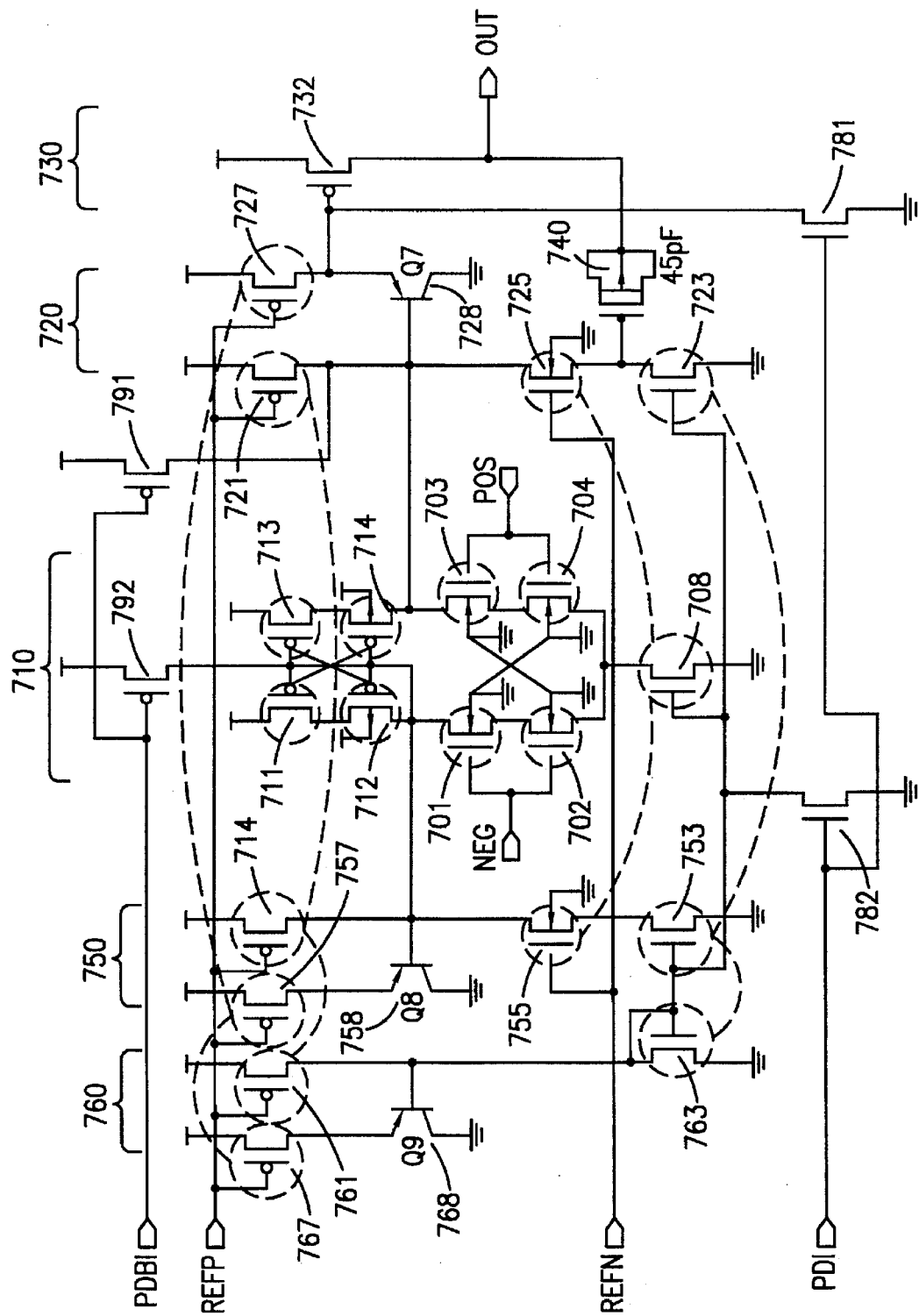
FIG. 7 schematically shows first preferred embodiment amplifier.

FIG. 6 schematically shows a known two-stage operational amplifier with reference numeral 600, which includes an input differential pair stage 610, isolation stage 620, an output stage 630, and a compensation capacitor 640. See, Ahuja. "An improved Frequency Compensation Technique for CMOS Operational Amplifiers", 18 IEEE J. Solid-State Circuits 629 (1983). The differential pair includes n-channel FETs 601–602 with current mirror p-channel FETs 611–612 providing the load for the differential pair and current source 608 supplying the current. The differential pair output at node 618 drives output stage p-channel FET 632. Isolation stage 620 is made of current sources 621 and 623 plus n-channel buffer FET 625. The current sources 621 and 623 arc matched to provide equal currents, and buffer FET 625 provides isolation of compensation capacitor 640 to remove the feedforward righthalf-plane zero and to increase the positive power supply noise rejection ratio which otherwise occur without the isolation stage and with the compensation capacitor 640 connected directly to first stage output node 618. Nora that opamp 600 uses only a positive 5 volt power supply, so the bias of the buffer FET 625 cannot just be ground but rather must be a reference voltage typically at about 2.5 volts.

A problem with implementation of the opamp 600 lies in the requirement that the current sources 621 and 623 be matched and provide exactly the same current. In fact, there will be differences in the currents from sources 621 and 623 and this difference current will flow into or out of the first stage and result in an offset voltage contribution due to the current mismatch of the differential pair. Indeed, the current sources 623 and 621 would be n-channel and p-channel FETs, respectively, and matching of the two would be more difficult than matching two p-channel FETs or two n-channel FETs. Furthermore, the difference current cannot just be swamped by large bias current through the differential pair due to the dependence of slew rate on the bias current together with the need to keep FET 625 biased: the current from sources 631 and 623 must be at least twice that of source 608.

Figure 8:
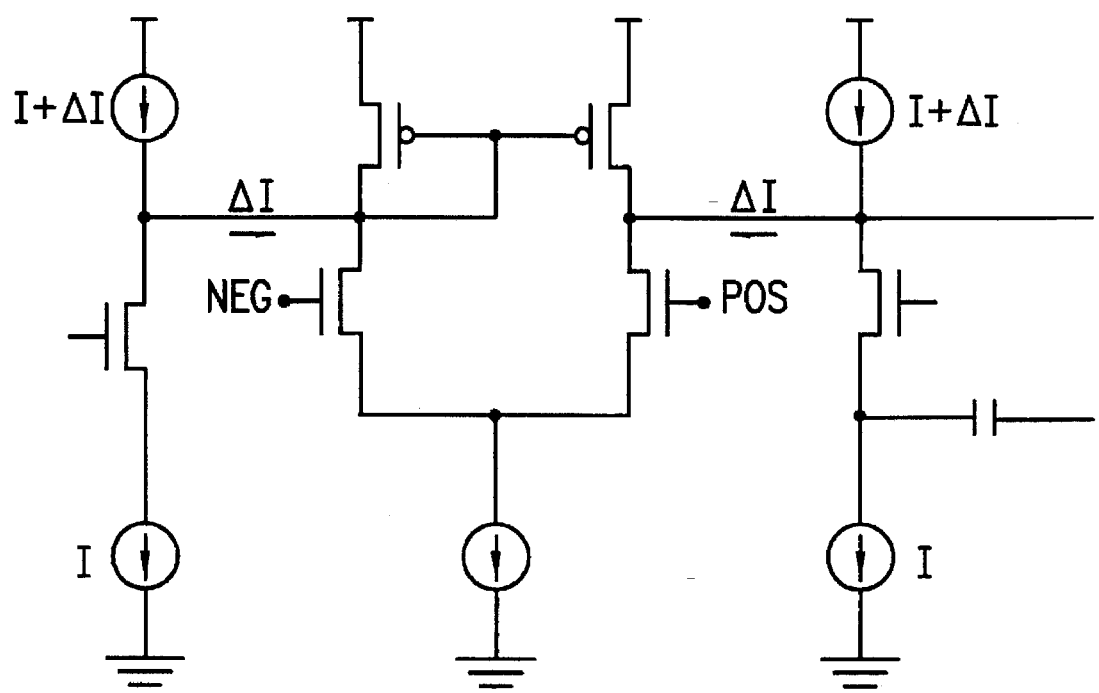
FIG. 8 (s a simplified version of FIG. 7.

FIG. 7 schematically shows opamp 700 which overcomes the current source matching problem of the opamp 600. In particular, opamp 700 provides a second symmetrical dummy isolation stage 750, including current sources 751 and 753 and buffer FET 755, in addition to the elements of opamp 600. Indeed, opamp 700 has input differential pair stage 710, isolation stage 720 (which includes buffer pnp 728 and current source 727), output stage 730, compensation capacitor 740, dummy isolation stage 750, and bias stage 760 which provides the bias for current sources 708,723 and 753. The differential pair includes cascode-connected n-channel FETs 701–702 and 703–704 with current mirror cascode-connected p-channel FETs 711–712 and 713–714 providing the load for the differential pair and current source 708 supplying the current. The cascode connections permit proper device sizing using a single circular FET layout structure. The differential pair output at node 718 drives isolation stage pnp 728 with current source 727 (to isolate the gate capacitance of p-channel output driver FET 732) which then drives output p-channel FET 732. As in opamp 600, buffer FET 725 provides isolation of compensation capacitor 740, and the current sources 721 (plus the base current from pup 728) and 723 are somewhat matched but still have a mismatch current. Opamp 700 also has dummy isolation stage 750 with devices matching those of isolation stage 720, both as to device type and size; that p-channel FET 751 matches p-channel FET 721, pnp 758 matches pnp 728, n-channel FET 753 matches n-channel FET 723, and p-channel FET 757 matches p-channel FET 727. Thus the mismatch current from dummy isolation stage 750 will match the mismatch current from isolation stage 720 and overcome the mismatch problem of opamp 600. FIG. 8 illustrates the mismatch currents in a simplified version of opamp 700. Of course, opamp 700 could be simplified by elimination of pnps 728 and 758 and p-channel FETs 727 and 757 if the capacitance of the output drivers were not significant.

To first order approximation, opamp 700 maintains a constant output drive current over temperature fluctuations. Indeed, p-channel FET 732 will drive less output current as the temperature increases, because its threshold voltage increases with temperature, which degrades $V_{GS}$. However, bipolar buffer pnp 728 provides more current as temperature increases, thus pulling the gate of FET 732 lower and thereby compensating for its threshold increase. The net effect is that as temperature increases, FET 732 gets weaker, but pnp 728 pulls its gate down farther, resulting a near constant output current.

FIG. 7 also shows bias stage 760 in opamp 700. Bias stage 760 matches isolation stage 720 and dummy isolation stage 750 in that the ratio of gate width of p-channel FET 761 to gate width of p-channel FET 721 (or p-channel FET 75 1) equals the ratio of gate widths of p-channel FET 767 to p-channel FET 727 (or 757) and the ratio of gate widths of n-channel FET 763 to n-channel FET 723 (or 753); the ratio is 1/4 for opamp 700. The pnps 728, 758, and 768 may all be the same size. P-channel bias reference REFP biases all of the p-channel FETs 721,727, 75 1, 757, 761, and 767, so the currents entering n-channel FETs 723 and 753 are matched (when there is no signal applied to the differential pair) and just four times the current entering n-channel FET 763. The n-channel FETs 723 and 753 are biased by n-channel FET 763 (they form current mirrors with the ratio of currents equal to four) to match the currents in isolation stage 720 and dummy isolation stage 750.

REFN biases the isolation FETs 725 and 755 to provide the ac ground for compensation capacitor 740. PDI provides a power down for opamp 700. PDI is low during normal operation of opamp 700. (and its complement PDBI high), but PDI going high turns on n-channel FETs 781–782 to pull down the gates of and turn off current sources 7(18. 723, 753, and 763 and to turn on p-channel 732 to pull up OUT. Further, PDBI simultaneously going low turns on p-channel FETs 791–792 to pull up nodes 718–719 and turn off current mirror load 711–714. In addition, nodes REFP and REFN are pulled low and high, respectively, by the internal master bias current generator (not shown in the FIGS.). Thus PDI disables opamp 700 and pulls up the output OUT. Thus the output of amplifier 410 of FIG. 4 pulls up to about 5 volts when a power down (PD#) signal is applied, but the pass FETs 441, 442, .. 49 will be turned off to isolate terminator 300 from each of the SCSI lines at R1, R2, . . . R9.

Resistor Array

Figure 9:
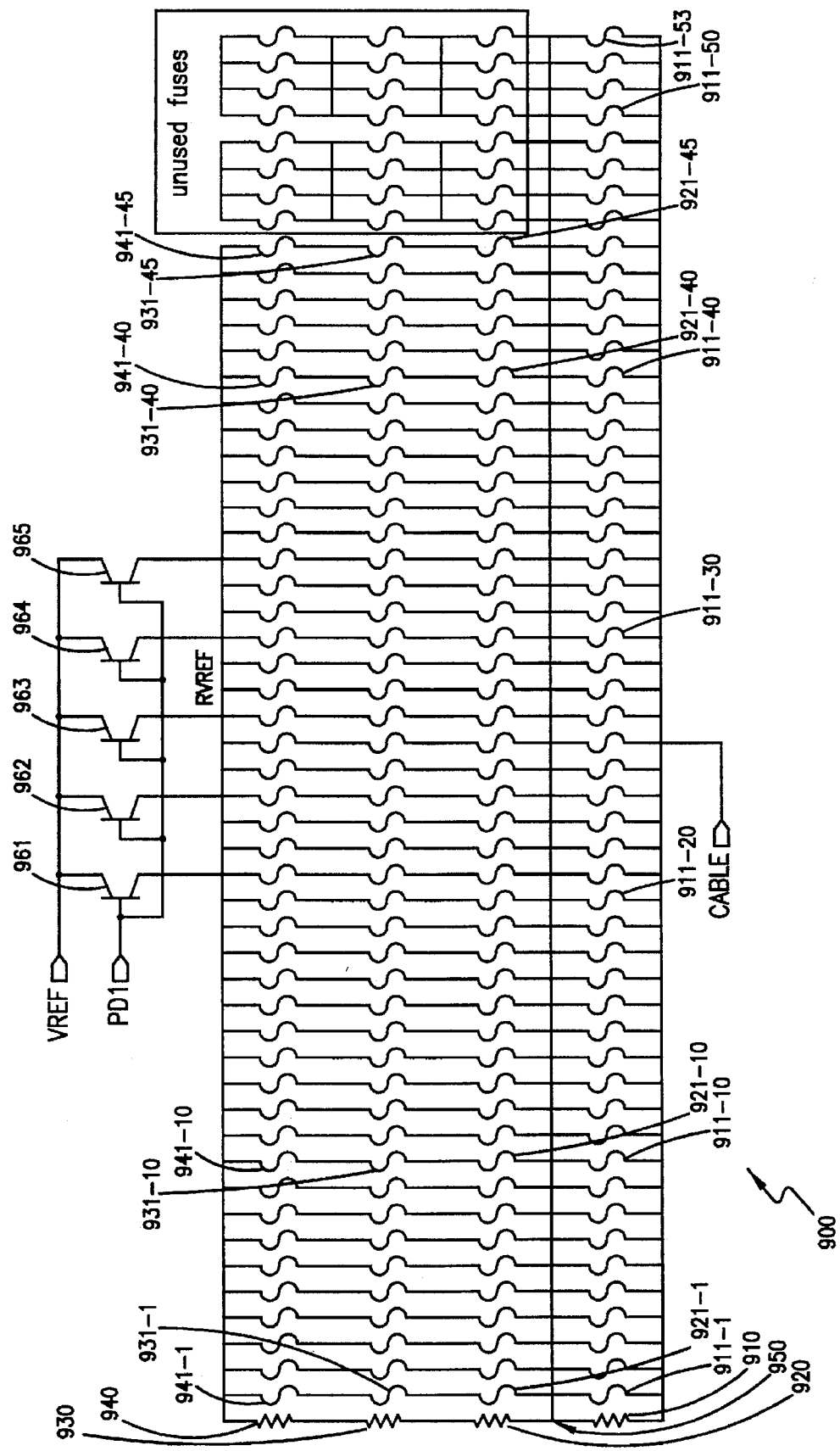
FIG. 9 shows a first preferred embodiment of an array of fuses that are divided into a smaller array of fuses that when combined form the resistors of the array of resistors shown in FIG. 4.

FIG. 9 shows resistor array 900 used to form each of the 110 ohm resistors of FIG. 4. Resistor array 900 includes four polysilicon resistors 910, 920, 930, and 940 each with nominal resistance of 37 ohms, fifty-three parallel polysilicon resistor 911-1, 911-2, . . . 911-53 in the bottom row, forty-five polysilicon resistors 921-1, 921-2, . . . 921-45, 931-1,931-2, . . . 931-45, and 941-1, 941-2, . . . 941-45 in each of the top three rows, respectively. The polysilicon is doped to about the 0 temperature coefficient of resistance level for stable resistance values over temperature. Each of the parallel resistors 911-1, . . . , 911-53,921-1, . . . , 921-45,931-1, . . . , 931-45, 941-1, . . . , 941-45 is in fact a polysilicon fuse which has a nominal resistance of 2.3 Kohms and can be laser blown. Conductor 950 divides the array into a coarse trim portion of the top three rows and a fine trim portion of the bottom row. The coarse trim portion is equivalent to a 111 ohm resistor plus forty-five 6.9 Kohm fuses all in parallel, and the fine trim portion is a 37 ohm resistor and fifty-three 2.3 Kohm fuses all in parallel. Of course, processing variations will make the actual resistances differ from the nominal resistances of the resistors and fuses, but if the nominal values were obtained, then the coarse trim portion would have a resistance between 111 ohms (all 6.9 Kohm fuses blown) and 64 ohms (no fuses blown), and the fine trim portion would have a resistance between 37 ohms (all 2.3 Kohm fuses blown) and 29 ohms (no fuses blown), so the overall array resistance could be selected between 93 and 148 ohms. Thus array 900 can tolerate an actual resistivity variation of more than 30%.

Trimming of array 900 to achieve an overall resistance of 110 ohms consists the following steps: (1) measure the overall resistance with to fuses blown: (2) use the measured overall resistance to estimate the resistivities; (3) laser blow the estimated number of fuses in the coarse trim portion that would yield an overall resistance of 110 if twenty-six (one half of the total) of the fine trim fuses were blown: (4) measure the overall coarse-trimmed resistance; (5) use the measurement to reestimate the resistivity; and (6) laser blow the estimated number of fuses in fine trim portion to yield the overall 110 ohms. The coarse trim usually yields an overall resistance within 2% of 110 ohms, and the fine trim typically yields an overall resistance of well within the 1% of 110 ohms required. Note that with forty-five parallel fuse legs in trim portion, the contribution of one leg when about half of the legs are not blown is about 1 ohm; and similarly for the fine trim portion the contribution of one leg when twenty-six legs are not blown is about ⅓ ohm.

FIG. 9 also shows the power down p-channel FETs 961–965 in parallel which make up one of the p-channel FETs 441,442, . . . or 449 in FIG. 4, and the VREF in FIG. 9 corresponds to the output of amplifier 410 in FIG. 4 and the CABLE output in FIG. 9 corresponds to one of the R1, R2, . . . or R9 outputs in FIG. 4. Also, the location of the FETs 441, 442, . . . and 449 between the 2.85 volts reference and the resistors limits their source-drain voltage variability. In particular, component FETs 961–965 are sized so that each of FETs 441, 442, . . . and 449 has an effective turned-on channel resistance of about 3.5 ohms (so the resistor array actually provides 106.5 ohms for the 110 ohm total); thus the source voltage will be 2.85 volts and the drain voltage will vary between 2.85 volts and 2.76 volts as the CABLE output varies between 2.85 volts and ground. Hence, the channel resistance will have negligible variation.

Further Modifications and Variations

The preferred embodiments may be modified in many ways while retaining one of more of the features of an amplifier with a dummy isolation stage for current source offset balancing and a trimmable resistor array made of two sets of parallel fuses. For example, the differential pair could be compound devices or have source-follower inputs or be made of bipolar devices or be multistaged. P-channel and n-channel devices could be interchanged (with the pnp devices changed into npn devices). Further, the output stage could be configured differently, such as a source follower stage or a class AB push-pull arrangement. The resistor array could have a reduced number of links for a smaller resistance variation.

What is claimed is:

1. An amplifier, comprising:
   (a) a differential input stage having a plurality of transistors arranged in a cascode configuration;
   (b) an isolation stage coupled to said differential input stage, said isolation stage with first and second current sources in series and including at least one bipolar junction transistor; and
   (c) a dummy stage coupled to said differential input stage symmetrically with respect to said isolation stage, said dummy stage with third and fourth current sources in series, said third current source matching said first current source and said fourth current source matching said second current source, said dummy stage further including at least one bipolar junction transistor;
   (d) whereby current source mismatches within said isolation stage between said first current source and said third current source are replicated in said dummy stage and symmetrically applied to said differential input stage.

2. An amplifier comprising:
   a bias stage having at least one bipolar junction transistor;
   a dummy isolation stage having at least one bipolar junction transistor;
   a differential input stage having a plurality of transistors arranged in a cascode configuration;
   an isolation stage having at least one bipolar junction transistor; and
   an output stage,
   wherein each of the foregoing stages is connected sequentially, and wherein said dummy isolation stage and said isolation stage have matched mismatched currents.

3. The amplifier of claim 2, wherein said dummy isolation stage and said isolation stage comprise matching elements.

4. The amplifier of claim 3, wherein said matching elements are two current sources and a buffer field effect transistor.

5. An amplifier comprising:
   (a) a differential input pair;
   (b) an isolation stage coupled to said pair, said isolation stage with first and second current sources in series and with a field effect transistor;
   (c) a dummy stage coupled to said pair symmetrically with respect to said isolation stage, said dummy stage with third and fourth current sources in series, said third current source matching said first current source and said fourth current source matching said second current source, said dummy stage further with a field effect transistor;
   (d) an output stage comprising a field effect transistor; and
   (e) wherein said isolation stage including a bipolar transistor connected to drive said output field effect transistor;
   (f) whereby current source mismatches within said isolation stage between said first current source and said third current source are replicated in said dummy stage and symmetrically applied to said pair.

* * * * *

UNITED STATES PATENT AND TRADEMARK OFFICE
CERTIFICATE OF CORRECTION

PATENT NO. : 5,635,873          Page 1 of 4
DATED : Jun. 3, 1997
INVENTOR(S) : Thrower et al.

It is certified that error appears in the above-identified patent and that said Letters Patent is hereby corrected as shown below:

| | |
|---|---|
| Column 1, line 38 | Replace "Tile" With --The-- |
| Column 2, line 32 | Replace "X3. 131" With --X3.131-- |
| Column 2, line 58 | Replace "(bows" With --shows-- |
| Column 3, line 3 | Replace "(s" With --is-- |
| Column 3, line 21 | Replace "310" With --301-- |
| Column 3, line 27 | Replace "3 10" With --310-- |
| Column 3, line 45 | Replace "651" With --6/51-- |
| Column 3, line 53 | Replace "5 10" With --510-- |

UNITED STATES PATENT AND TRADEMARK OFFICE
CERTIFICATE OF CORRECTION

PATENT NO. : 5,635,873
DATED : Jun. 3, 1997
INVENTOR(S) : Thrower et al.

It is certified that error appears in the above-identified patent and that said Letters Patent is hereby corrected as shown below:

Column 3, line 66        After "consider"
Insert --the--

Column 4, line 2        After "amplifier"
Insert --(opamp)--

Column 4, line 3        After "610"
Insert --an--

Column 4, line 5        Replace "Ahuja."
With --Ahuja,--

Column 4, line 14        Replace "arc"
With --are--

Column 4, line 20        Replace "Nora"
With --Note--

Column 4, line 32        Before "matching"
Insert --so a--

Column 4, line 38        Replace "631"
With --621--

UNITED STATES PATENT AND TRADEMARK OFFICE
CERTIFICATE OF CORRECTION

PATENT NO. : 5,635,873
DATED : Jun. 3, 1997
INVENTOR(S) : Thrower et al.

It is certified that error appears in the above-indentified patent and that said Letters Patent is hereby corrected as shown below:

| | |
|---|---|
| Column 4, line 62 | Replace "pup" With --pnp-- |
| Column 4, line 65 | After "that" Insert --is,-- |
| Column 5, line 24 | Replace "75 1) With --751)-- |
| Column 5, line 30 | Replace "75 1," With --751,-- |
| Column 5, line 43 | Replace "7(18." With --708,-- |
| Column 5, line 53 | Replace "49" With --449-- |
| Column 6, line 21 | Replace "to" With --no-- |
| Column 6, line 25 | Replace "blown:" With --blown;-- |

UNITED STATES PATENT AND TRADEMARK OFFICE
CERTIFICATE OF CORRECTION

PATENT NO. : 5,635,873

DATED : Jun. 3, 1997

INVENTOR(S) : Thrower et al.

It is certified that error appears in the above-indentified patent and that said Letters Patent is hereby corrected as shown below:

Column 6, line 33       Before "trim"
                            Insert --the coarse--

Signed and Sealed this

Sixth Day of January, 1998

Attest:

BRUCE LEHMAN

Attesting Officer        Commissioner of Patents and Trademarks